(12) United States Patent
Goldman

(10) Patent No.: US 6,611,176 B1
(45) Date of Patent: Aug. 26, 2003

(54) METHOD AND APPARATUS FOR TWO ZEROS/TWO POLES ACTIVE COMPENSATION PHASE LOCKED LOOPS

(75) Inventor: Stanley J. Goldman, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 200 days.

(21) Appl. No.: 09/745,985

(22) Filed: Dec. 21, 2000

(51) Int. Cl.[7] .............................................. H03L 7/093
(52) U.S. Cl. ................... 331/17; 331/25; 331/DIG. 2; 327/156
(58) Field of Search ............................... 331/8, 17, 18, 331/25, DIG. 2; 327/156–159; 375/376; 455/260; 360/51

(56) References Cited

U.S. PATENT DOCUMENTS 5,315,623 A * 5/1994 Kuo ............................ 375/120

6,064,273 A * 5/2000 Donohue ..................... 331/17

\* cited by examiner

*Primary Examiner*—David Mis
(74) *Attorney, Agent, or Firm*—J. Dennis Moore; W. James Brady, III; Frederick J. Telecky, Jr.

(57) ABSTRACT

A phase locked loop with two zeros/two poles active compensation. The two poles and two zeros provide increased stability with capability for narrow bandwidth and the active component (such as operational amplifier) provides increased gain and higher noise immunity. Schematic diagrams of exemplary and preferred embodiments, design assumptions, and associated equations are disclosed. Other assumptions and equations are within the scope of the invention, provided the disclosed format for an open loop voltage transfer function for two zeros/two poles is maintained.

11 Claims, 3 Drawing Sheets

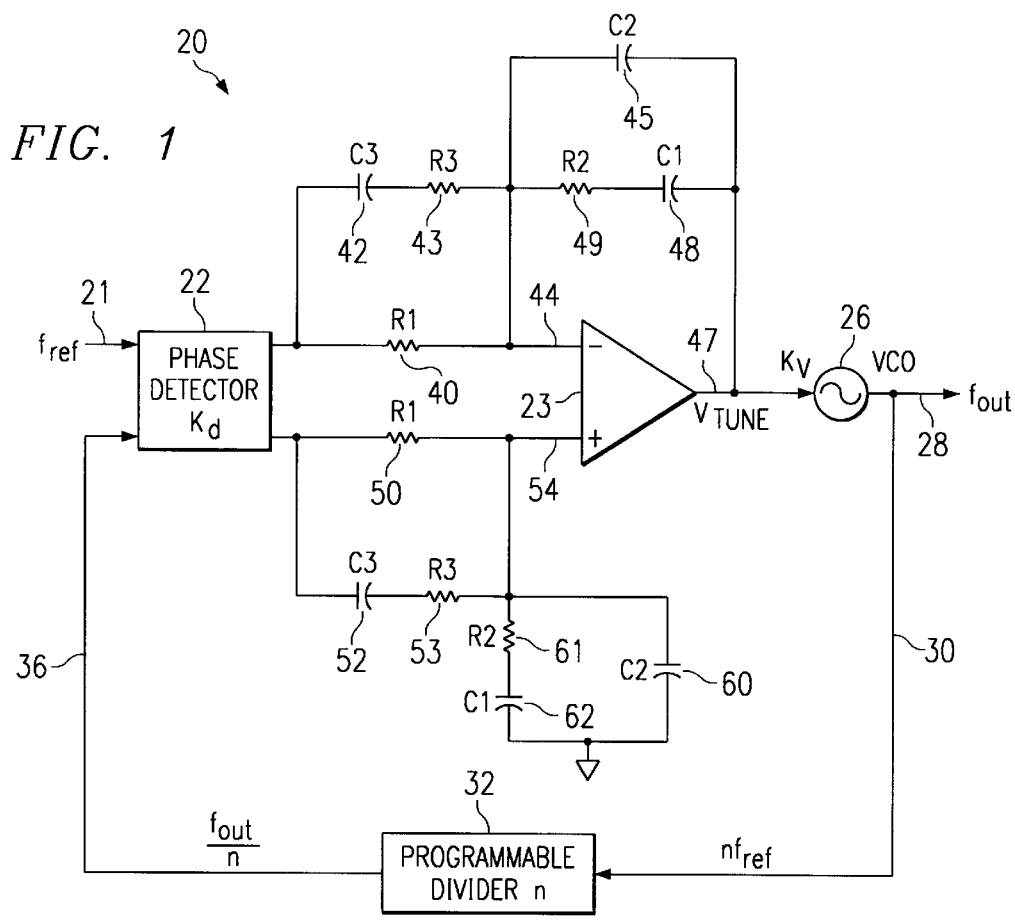

METHOD AND APPARATUS FOR TWO ZEROS/TWO POLES ACTIVE COMPENSATION PHASE LOCKED LOOPS

TECHNICAL FIELD OF THE INVENTION

This invention relates to phase locked loops, which are designed with two zeros/two poles active compensation.

BACKGROUND OF THE INVENTION

A phase locked loop provides the means for generating an output signal whose frequency is a multiple of the input reference frequency ($f_{ref}$), in a manner that synchronizes (or locks) the relationship between the phases and frequencies of the input and output signals. The phase locked loop is a specialized form of a feedback control system. In this case, a voltage controlled oscillator (VCO) is used to multiply its input frequency by a factor of n to generate the output frequency ($f_{out}$). In order to compare $f_{out}$ with the input reference frequency ($f_{ref}$), the VCO output is divided by n and then fed back to the VCO and loop filter compensation circuits through a phase detector. The phase detector produces a pulse error voltage on each rising edge of the reference signal that has a pulse width equal to the phase difference between the reference frequency ($f_{ref}$) and the output frequency divided by n, $f_{out}/n$. The loop filter converts the pulsed error voltage to a DC voltage that is used to control the VCO. This DC control voltage causes the VCO to slightly change $f_{out}$ in a direction that reduces the phase difference between the two frequencies, thus also reducing the frequency difference between the input and output signals. This error correcting cycle is repeated for each reference frequency cycle period, ultimately resulting in a minimum difference between the two frequencies. The phase locked loop is described as "locked" when the phase difference between the two signals has stabilized.

A phase locked loop is considered to have three states of operation. The loop is in the unlocked state when power is first applied. It is in the acquisition state when the oscillators are being synchronized. Finally, it is in the locked state when $f_{out}/n$ is equal to the average $f_{ref}$ and the period of $f_{out}/n$ has a fixed phase or locked relationship to the average $f_{ref}$ period. This is achieved when the error reference signal reaches a steady state condition.

Presently, phase locked loops are commonly designed with one zero compensation in order to avoid stability problems associated with additional zeros. (A zero in a network function represents any real or complex value which when substituted for the Laplace transform s can cause the network transfer function to become zero. Therefore, in the transform function of the phase locked loop compensation circuit, the zero is visible as a function in the numerator which can have a value which will cause the transform function to become zero.) These phase locked loop designs typically utilize charge pumps and large capacitors when narrow loop bandwidths are required. (The charge pump in a phase locked loop implementation is essentially a current source that is controlled by the phase error, i.e. a pulsed current source.) The physical space required for the large capacitors associated with narrow loop bandwidth phase locked loops presently prevents the development of totally integrated circuit solutions for these charge pump based designs. Secondarily, the low output currents required from the charge pumps associated with these designs further limit the practicality of these implementations.

Similarly, phase locked loops with active filter compensation have not been totally achieved on integrated circuits because of the physical space previously required for the high performance operational amplifier (op amp) required for these circuits, as well as the physical size of required capacitors. (An active filter is defined as a filter with an op amp in the loop compensation circuit.)

Thus, designs for narrow loop bandwidth phase locked loops typically have a single zero and are implemented with discrete components or a combination of an integrated circuit resident charge pump and external resistors and capacitors. With the advances in op amp semiconductor technology and the utilization of two zeros/two poles compensation, it is now possible to incorporate the different total phase locked loop circuitry on a single integrated circuit device.

SUMMARY OF THE INVENTION

This invention provides active filter compensation phase locked loops designed with two zeros followed by two poles. A pole in a network function represents any real or complex value that can be substituted for the Laplace transform s, causing the network transfer function to be infinite. Thus, the number of poles in a network is determined by the number of terms in the denominator of the circuit's transfer function that can have a value for s that will cause the transfer function to become infinite.

The addition of the second zero provides more phase compensation and thus greater stability for the phase locked loop. The op amp provides differential high gain amplification that cannot be achieved with a charge pump. The two poles provide two perfect integrators at the origin in the network transfer function in what is known as a Type 2 phased locked loop. One of these integrators comes from the active compensation circuit and the other is from the VCO. In keeping with phase locked loop standard practice, the pole provided by the VCO does not impact the invention. Therefore, further description of this pole is not necessary. In addition, two more high frequency poles in the active compensation circuit correct for the instability induced by the two zeros. The use of active filters with two zeros/two poles allows phase locked loops to be designed with narrower loop bandwidths and higher loop stability than can be accomplished utilizing the typical single zero, charge pump compensation method.

In addition, this invention results in designs that can be totally incorporated on integrated circuits. This is possible for two reasons. First, the invention results in designs with smaller sized capacitors than typically utilized with charge pump based phased locked loops for a specific frequency. Secondarily, the invention utilizes state-of-the-art high performance op amps that are now feasible on integrated circuits as a result of capacitor metal oxide semiconductor (CMOS) technology advances.

The phase locked loop with two poles/two zeros active compensation is comprised of circuit elements which are characteristic of all phase locked loops. These are a phase detector, VCO, and programmable divider. The input to the phase locked loop is a signal with input voltage level operating at a reference frequency ($f_{ref}$); the output from the phase locked loop has a frequency $f_{out} = n \cdot f_{ref}$. The two poles/two zeros active compensation circuit of the phase locked loop is typically achieved with a combination of resistors, capacitors, and operational amplifier.

Equations are developed for synthesis of the two zeros/two pole active compensation phase locked loop based upon assumptions for initial circuit parameters such as reference frequency, voltage controlled oscillator gain, feedback divide ratio, damping factor, desired loop bandwidth, and desired phase detector gain.

BRIEF DESCRIPTION OF THE VIEWS OF THE DRAWINGS

FIG. 1 is a representative schematic of the invention.

FIG. 2 provides a 2 zeros/2 poles Bode magnitude plot for the compensation portion of a phase locked loop with $f_x$=10 khz, with accentuation of effect of zeros for illustration purposes.

DETAILED DESCRIPTION OF THE PREFERRED EMBODIMENTS

Figure 3:
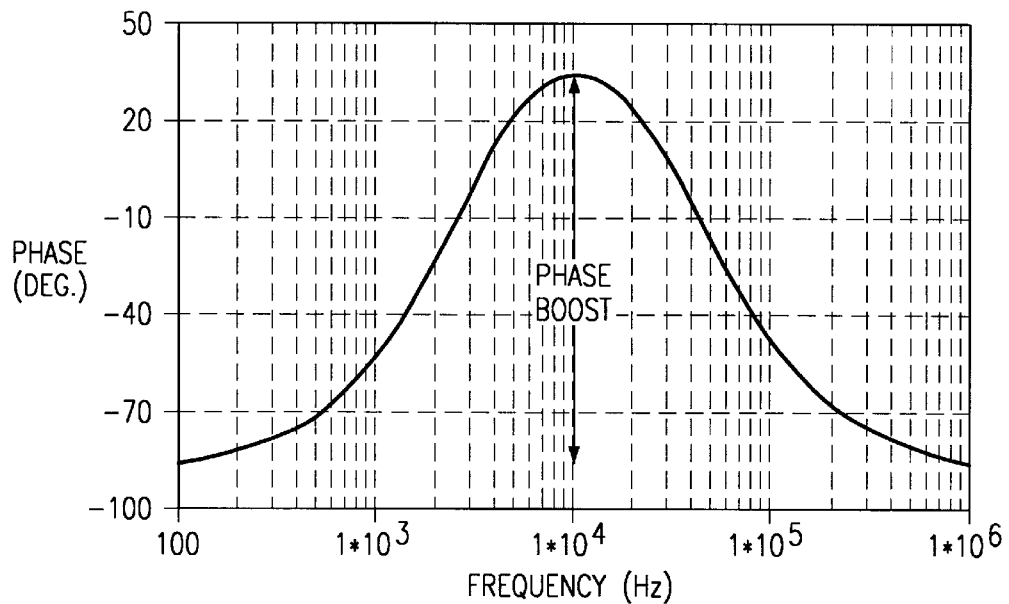
FIG. 3 provides an illustration of a Bode phase plot for the compensation portion of a 2 zeros/2 poles active compensation phase locked loop, with $f_x$=10 khz.

In FIG. 1, a representative embodiment of the 2 zeros/2 poles active compensation phase locked loop 20 comprises an input $f_{ref}$ 21 connected to phase detector $K_d$ 22 connected to an op amp 23 through a resistor/capacitor network. The output of op amp 23 drives a VCO 26 providing output $f_{out}$ 28 that is equal to n times $f_{ref}$. The signal at output 28 drives a programmable divider 32 on lead 30. The output of programmable divider 32 connects to a second input of the phase detector 22 on lead 36. Between the phase detector 22 and op amp 23, a resistor capacitor network provides a series resistor 40 in parallel with series connected capacitor 42 and resistor 43 on the lead 44. Capacitor 45 is connected in parallel with op amp 23 on lead 44 and its output on lead 47. Capacitor 45 and op amp 23 are also connected in parallel with series connected capacitor 48 and resistor 49. On the other output of the phase detector 22, a series resistor 50 in parallel with series connected capacitor 52 and resistor 53 is connected to the+lead 54 of op amp 23. Between the op amp+lead 54 and ground, a series capacitor 60 is connected in parallel with series connected resistor 61 and capacitor 62.

Representative devices for implementation of the phase locked loop are the Motorola MC12040 for the phase detector 22, Texas Instruments' TI OP27 for the op amp 23, Motorola MC 1648 for the VCO 26, and Texas Instruments' TI 74163 for the programmable divider 32.

Using feedback theory, the closed loop voltage transfer function ($V_o/V_i$) for a 2 zeros/2 poles active compensation circuit with a high gain, wide bandwidth ideal op amp (no poles), is approximately equal to $Z_2/Z_1$ as shown by Equation 1. (The assumption for an ideal op amp can be rationalized on the basis that the effect of any poles resulting from the op amp will be insignificant in comparison to the effect of the filter portion of the compensation circuit.)

$$V_o/V_i = Z_2/Z_1 \tag{1}$$

For the schematic of FIG. 1, $Z_1$ equals $R_1$ in parallel with ($R_3$+1/($sC_3$)), where 1/$sC_3$ represents the Laplace transform of $C_3$ and $s=j\omega=j2\pi f$.

This produces Equation 2:

$$Z_1 = \frac{R_1 \cdot (s \cdot C_3 \cdot R_3 + 1)}{s \cdot C_3 \cdot (R_1 + R_3) + 1} \tag{2}$$

In a similar manner, $Z_2$ equals 1/(s $C_2$) in parallel with ($R_2$+(1/$sC_1$)) which produces Equation 3:

$$Z_2 = \frac{s \cdot C_1 \cdot R_2 + 1}{s \cdot (C_1 + C_2) \cdot \left(1 + s \cdot C_2 \cdot R_2 \cdot \frac{C_1}{C_1 + C_2}\right)} \tag{3}$$

Substituting Equations 2 and 3 into Equation 1 for $Z_2/Z_1$ produces Equation 4 for the voltage transfer function of the 2 zeros/2 poles active filter compensation circuit.

$$\frac{V_o}{V_i} = \tag{4}$$

$$\frac{1}{s \cdot (C_1 + C_2) \cdot R_1} \cdot \frac{s \cdot C_1 \cdot R_2 + 1}{1 + s \cdot R_2 \cdot C_2 \cdot \left(\frac{C_1}{C_1 + C_2}\right)} \cdot \frac{s \cdot (R_1 + R_3) \cdot C_3 + 1}{s \cdot R_3 \cdot C_3 + 1}$$

In order for the 2 zeros/2 poles compensation circuit to provide the desired stability, the general form of the required transfer function places two zeros at $f_x/k^{1/2}$ below the 0 dB crossover frequency ($f_x$), places two poles at $f_x \cdot k^{1/2}$ above $f_x$, and reduces the loop gain to properly position $f_x$. (The term k represents a geometric form factor associated with the phase locked loop. The $f_x$ of the phase locked loop is the frequency where the open loop magnitude (or gain) crosses 0 dB.)

FIGS. 2 and 3 illustrate the form of a Bode magnitude plot (accentuated for illustration purposes) for circuits meeting these requirements. Equation 5 shows the general form of this desired transfer function:

$$\frac{V_o}{V_i} = \frac{1}{\left(\frac{s}{\omega_x \cdot \frac{G_x}{k}}\right)} \cdot \frac{\left[1 + \frac{s}{\frac{\omega_x}{\sqrt{k}}}\right] \cdot \left[1 + \frac{s}{\frac{\omega_x}{\sqrt{k}}}\right]}{\left(1 + \frac{s}{\omega_x \cdot \sqrt{k}}\right) \cdot \left(1 + \frac{s}{\omega_x \cdot \sqrt{k}}\right)} \tag{5}$$

where s represents the Laplace transform notation $s=j\omega=2\pi f$; $G_x$ represents the gain at the crossover frequency; k represents the geometric form factor, $\omega_x$ represents $2\pi f_x$; and $f_x$ represents the open loop 0 dB gain crossover frequency.

Using prior definitions, it can be seen that the configuration of Equation 5 clearly depicts the two zeros in the numerator:

$$1 + \frac{s}{\frac{\omega_x}{\sqrt{k}}} \tag{6}$$

Format of numerator term shows one of the two zeros at $f=f_x/k^{1/2}$.

Two poles in the denominator:

$$1 + \frac{s}{\omega_x \cdot \sqrt{k}} \tag{7}$$

Format of denominator term shows one of the two poles at $f=f_x \cdot k^{1/2}$. In addition, the first term shows a pole or integrating function at the point where the frequency is equal to zero. As discussed previously, the two poles associated with the circuit provide compensation for the two zeros, negating the effect of the zeros for higher frequencies.

Equation 8 shows a format of the denominator term which shows the magnitude scaling factor k, $G_x$, and integrator (pole) contributed by s.

$$\frac{s}{\omega_x \frac{G_x}{k}} \tag{8}$$

The advantage provided by the 2 zeros/2 poles active compensation relationship of Equation 5 over a one zero/one pole phase locked loop is that the phase increase for 2 zeros/2 poles is centered at $f_x$ and the amount of phase boost is adjusted with the k factor, providing greater ability to increase the amount of phase boost which, in turn, increases the stability.

From feedback theory, the phase boost effect ($\theta_{boost}$) at $f_x$ associated with 2 zeros/2 poles compensation is determined by multiplying the zero's phase (imaginary part divided by the real part) by two (for two zeros) and subtracting two (for two poles) times the pole's phase (imaginary part divided by the real part). In this case, the zero's phase is $\operatorname{atan}(k^{1/2})$ and the pole's phase is equal to $\operatorname{atan}(k^{-1/2})$. The result is shown by Equation 9.

$$\theta_{boost} = 2\operatorname{atan}(k^{1/2}) - 2\operatorname{atan}(k^{-1/2}) \tag{9}$$

where k=the geometric factor.

The following trigonometric identity is used to simplify Equation 9:

$$\operatorname{atan}(x) + \operatorname{atan}\left(\frac{1}{x}\right) = \frac{\pi}{2} \tag{10}$$

$$\operatorname{atan}(x) - \pi/2 = -\operatorname{atan}\left(\frac{1}{x}\right)$$

$$\operatorname{atan}(x) - \pi/2 = \operatorname{atan}(1/x) \tag{10}$$

Solving and simplifying Equation 9 with the identity in Equation 10 produces Equation 11 for the geometric factor k that centers the two poles and two zeros around the 0 dB crossover point for the amount of phase boost desired for the phase locked loop.

$$\theta_{boost} = 4((\operatorname{atan}(k))^{1/2} - 45°)$$
$$4\operatorname{atan}(k^{1/2}) = \theta_{boost} + 4(45°)$$

$$k = \tan(\theta_{boost}/4 + 45)^2 \tag{11}$$

where k is the unit-less geometric form factor and $\theta_{boost}$ is in degrees.

The active compensation gain ($G_x$) required to achieve the required open loop 0 dB (unit gain) at $f_x$ for the schematic of FIG. 1 is calculated with Equation 12, as follows:

$$G_x = \frac{1}{\left(\frac{K_d \cdot K_v}{n \cdot \omega_x}\right)} \tag{12}$$

where $K_d$ represents the phase detector gain, $K_v$ represents voltage controlled oscillator (VCO) gain, n represents the programmable divider ratio, $\omega_x$ represents $2\pi f_x$, and $G_x$ represents the 2 zeros/2 poles active compensation gain that is required to produce overall open loop unit gain for the phase locked loop with 2 zeros/2 poles active compensation.

The design (or synthesis) of a two zeros/two poles active compensation phase locked loop also requires the use of the following standard phase locked loop equations for calculation of the phase margin ($\theta_{margin}$) of the damping factor ($\xi$), $f_x$, and $\theta_{boost}$:

$$\theta_{margin}(\zeta) = \operatorname{atan}\left(2 \cdot \zeta \cdot \sqrt{2 \cdot \zeta^2 + \sqrt{4 \cdot \zeta^4 + 1}}\right) \cdot \frac{180}{\pi} \tag{13}$$

$$f_x = BW \cdot \frac{\sqrt{2 \cdot \zeta^2 + \sqrt{4 \cdot \zeta^4 + 1}}}{\sqrt{1 + 2 \cdot \zeta^2 + \sqrt{(1 + 2 \cdot \zeta^2)^2} + 1}} \tag{14}$$

where BW=bandwidth $$\theta_{boost} = 2\operatorname{atan}(k^{1/2}) - 2\operatorname{atan}(k^{-1/2}) \tag{15}$$

$$= \theta_{margin}(\zeta) + 180° \ (f_x / f_{ref})$$

The $\theta_{margin}(\xi)$ is a stability term that is also defined in terms of the system's open-loop frequency response. It is defined as 180° minus the absolute value of the loop phase angle at a frequency ($f_x$) where the loop gain is unity (1 or 0 dB) or, in other words, it is the number of degrees away from the unstable open loop 180° phase angle. As shown by Equation 15, the $\theta_{boost}$ can also be expressed in terms of the $\theta_{margin}$ ($\xi$) plus the effect of the sampling delay which is equal to $180° f_x/f_{ref}$.

Using the equations developed from control system and phase locked loop theory and the schematic of FIG. 1, it is now possible to accomplish the design of a two zeros/two poles active compensation phase locked loop. The terms of Equations 4 and 5 can be equated for component relationships that achieve the desired transfer function for the schematic of FIG. 1. The results of this process are summarized by Equations 16 through 20.

The first and second zeros equate to Equations 16 and 17:

$$\frac{1}{C_1 \cdot R_2} = \frac{2 \cdot \pi \cdot f_x}{\sqrt{k}} \tag{16}$$

$$\frac{1}{C_3 \cdot (R_1 + R_3)} = \frac{2 \cdot \pi \cdot f_x}{\sqrt{k}} \tag{17}$$

The first and second poles equate to Equations 18 and 19:

$$\frac{1}{R_3 \cdot C_3} = 2 \cdot \pi \cdot f_x \cdot \sqrt{k} \tag{18}$$

$$\frac{1}{\frac{C_1 \cdot C_2}{(C_1 + C_2)} \cdot R_2} = 2 \cdot \pi \cdot f_x \cdot \sqrt{k} \tag{19}$$

Finally, the phase locked loop integrator term equates to Equation 20:

$$\frac{1}{(C_1 + C_2) \cdot R_1} = \omega_x \cdot \frac{G_x}{k} \tag{20}$$

At this point, five equations (Equations 16–20) have been developed defining relationships between the six passive components of the 2 zeros/2 poles active compensation phase locked loop. These equations also have three additional unknowns (k, $G_x$, and $f_x$) which define the compensation transfer function. In addition, Equations 11–15 provide five equations for another possible seven unknowns (or characteristics to be defined). For the purposes of this invention, any synthesis process which achieves the characteristics of equations for the two zeros/two poles active compensation phased lock loop satisfies the embodiment of the invention. The preferred embodiment described in the following paragraphs provides an example of one methodology that can achieve such a design. It should be emphasized that the final selection of component values is the result of an iterative process that includes tradeoffs between component sizes and circuit operational characteristics.

As a starting point for determining the passive components of the invention, an iterative process can be used to select the minimum value of $R_2$. As can be seen from examining Equations 16–19, the value of $R_2$ determines the largest sized capacitor ($C_1$) for the circuit. Since one of the goals of the invention is to achieve a stable phase locked loop that can be entirely implemented on an integrated circuit, this provides a determination of a critical component for an integrated circuit based implementation. The minimum practical value for $R_2$ will also result in a design that produces lower jitter and noise than is otherwise possible. (A similar implementation can be accomplished by selecting a maximum value for $C_1$ and solving for $R_2$.)

Once values for $R_2$, $G_x$, $f_x$, and k are determined, the value of the remaining passive components can be calculated by substituting these values into Equations 21 through 25 for $C_1$, $C_2$, $C_3$, $R_1$, and $R_3$:

$$C_1 = \frac{\sqrt{k}}{2 \cdot \pi \cdot f_x \cdot R_2} \quad (21)$$

$$C_2 = \frac{C_1}{k-1} \quad (22)$$

$$R_1 = \frac{1}{2 \cdot \pi \cdot f_x \cdot G_x \cdot C_2} \quad (23)$$

$$R_3 = \frac{R_1}{k-1} \quad (24)$$

$$C_3 = \frac{1}{2 \cdot \pi \cdot f_x \cdot \sqrt{k} \cdot R_3} \quad (25)$$

Thus, all equations for calculating the component values for a two zero/two pole active compensation phased locked loop have been developed with assumptions being required for $R_2$ and circuit operation requirements determining the values for k, $f_x$, and $G_x$. Similar equations can be developed for a combination of any five of these components when an assumption is made for the remaining sixth component and the other three unknowns.

The procedure for synthesizing a phase locked loop with two zeros/two poles active compensation based upon an assumed value for $R_2$, plus desired active circuit operation characteristics is provided by the following paragraphs. (A similar process is utilized when other assumed component values are made.)

First, specify the initial value for $R_2$. Second, specify the desired reference frequency ($f_{ref}$) damping factor ($\xi$), bandwidth (BW), reference frequency multiplying factor (also known as the feedback dividing factor (n)), phase detector gain ($K_d$), and VCO gain ($K_v$). Third, calculate the phase margin for the desired damping factor using Equation 13. Fourth, calculate $f_x$ for the desired bandwidth and damping factor using Equation 14. Fifth, calculate the phase boost ($\theta_{boost}$) using Equation 15. Sixth, calculate the k factor and the gain attenuation ($G_x$) at $f_x$ from the magnitude and phase of the uncompensated open loop at the 0 dB crossover point using Equations 11 and 12. Finally, these results and the assumed value for $R_2$ are substituted into Equations 21 through 25 and are used to solve for the remaining passive component values. If the passive component values are not within the desired size ranges, the value of $R_2$ and other operational characteristics should be adjusted and the process should be repeated.

Table 1 shows initial design parameters for an example phase locked loop with two zeros/two poles active compensation. For this example, $R_2$ has been set to 300 kohms as an assumption for the smallest resistor value that will yield reasonable capacitor values and minimize the generation of jitter through reference side bands.

TABLE 1

| Design Parameter | Value |
| --- | --- |
| Reference Frequency = $f_{ref}$ | 128K |
| VCO gain = Kv | 400E6 rad/s/V |
| Reference frequency multiplying factor (feedback divide ratio) = n | 128 |
| Loop Bandwidth = BW | 125 KHz |
| Damping Factor = $\zeta$ | .5 |
| Phase Detector Gain = Kd | .1 V/rad |

With these parameters as a starting point, Equation 13 is used to convert the damping factor ($\xi$) to phase margin ($\theta_{margin}$ ($\xi$)); see Equation 26.

$$\theta_{margin}(\zeta) := \mathrm{atan}\left(2 \cdot \zeta \cdot \sqrt{2 \cdot \zeta^2 + \sqrt{4 \cdot \zeta^4 + 1}}\right) \cdot \frac{180}{\pi} = 52° \quad (26)$$

Next, $f_x$ is calculated from the desired BW and $\xi$ using Equation 14, with the result shown by Equation 27.

$$fx = BW \cdot \frac{\sqrt{2 \cdot \zeta^2 + \sqrt{4 \cdot \zeta^4 + 1}}}{\sqrt{1 + 2 \cdot \zeta^2 + \sqrt{(1 + 2 \cdot \zeta^2)^2 + 1}}} = 10.5 \text{ kHz} \quad (27)$$

Using Equation 15, the amount of $\theta_{boost}$ equals the $\theta_{margin}(\xi)$ (52°) plus the effect of sampling delay (180°$f_x$/$f_{ref}$)

$$\theta_{boost} = \theta_{margin}(\xi) + 180°(f_x/f_{ref}) = 66° \quad (28)$$

Then, the k factor and the gain attenuation at the 0 dB crossover frequency (gain attenuation=$G_x$) are computed from the magnitude and phase of the uncompensated open loop at the 0 dB crossover point using Equations 11 and 12.

$$k = \tan(\theta_{boost}/4 + 45)^2 = (\tan((66°/4) + 45°))^2 = 3.4 \quad (29)$$

$$G_x = \left(\frac{1}{\frac{K_d \cdot K_v}{n \cdot \omega_x}}\right) = .211 \quad (30)$$

Finally, Equations 21 through 25 are solved using the assumed value of $R_2$=300 kohms and needed calculated results from above.

$$C_1 = \frac{\sqrt{k}}{2 \cdot \pi \cdot f_x \cdot R_2} = 100 \text{ pF} \quad (31)$$

-continued $$C_2 = \frac{C_1}{k-1} = 27 \text{ pF} \quad (32)$$

$$R_1 = \frac{1}{2 \cdot \pi \cdot f_x \cdot G_x \cdot C_2} = 2.2 \text{ Mohm} \quad (33)$$

$$R_3 = \frac{R_1}{k-1} = 610 \text{ Kohm} \quad (34)$$

$$C_3 = \frac{1}{2 \cdot \pi \cdot f_x \cdot \sqrt{k} \cdot R_3} = 10 \text{ pF} \quad (35)$$

Table 2 provides a summation of these calculation results, as well as a comparison with a charge pump solution for a phase locked loop using an equivalent value for $C_1$.

TABLE 2

| Component (Gain) | Charge Pump | 2 Zeros/2 Poles Active Compensation |
|---|---|---|
| $K_d$ | 50 nA/rad | .1 V/rad |
| R1 | 0 | 2.2 megΩ |
| R2 | 900 kΩ | 300 kΩ |
| R3 | N/A | 610 kΩ |
| C1 | 100 pF | 1-pF |
| C2 | 1 pF | 27 pF |
| C3 | N/A | 10 pF |

Note that $K_d$ was defined for the example design, and calculated for the charge pump. The charge pump design was adjusted so that the largest capacitor ($C_1$) would be as close as possible to the 2 zeros/2 poles active compensation circuit. This was done since the size of the capacitor is a major factor in determining the feasibility and area penalty for placing the phase locked loop on an integrated circuit. However, keeping the size of this capacitor the same, results in a charge pump phase detector gain requirement of 50 nA/rad which is too low to be feasible for implementation. The 50 nA/rad gain results in a low signal-to-noise ratio and high coupling factor for unwanted signals. In addition, the phase margin associated with this charge pump loop will also be much lower than that of the two zeros/two poles active compensation loop. This will consequently result in even lower stability for the charge pump implementation. Thus, a practical charge pump implementation which approximates the characteristics of the two zeros/two poles active compensation design will result in a design that is less stable and impractical for total implementation on an integrated circuit.

Figure 4:
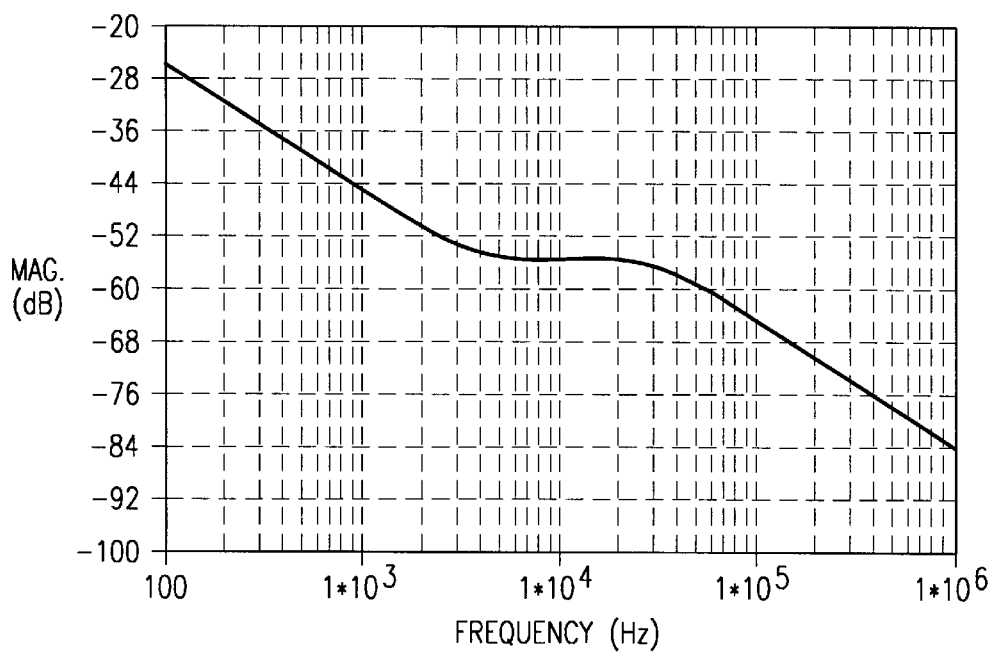
FIG. 4 provides a Bode magnitude plot of the compensation portion of the example 2 zeros/2 poles active compensation loop.

FIG. 4 shows the Bode magnitude plot of the two zeros/two poles active compensation portion of the phase locked loop.

Figure 5:
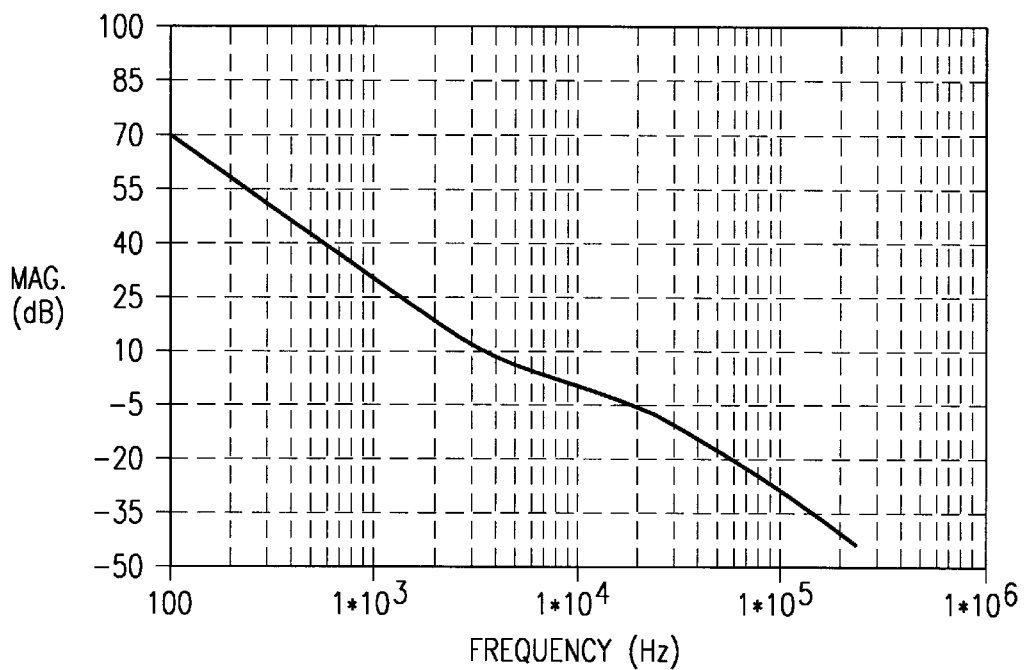
FIG. 5 provides an open loop Bode magnitude plot of the example 2 zeros/2 poles active compensation phase locked loop of Table 1.

FIG. 5 shows the Bode open loop magnitude plot of the FIG. 1 phase locked loop with the 2 zero/2 pole active compensation circuit implementation of Table 1. The response crosses the 0 dB magnitude point at the designed frequency of 10.5 kHz.

Figure 6:
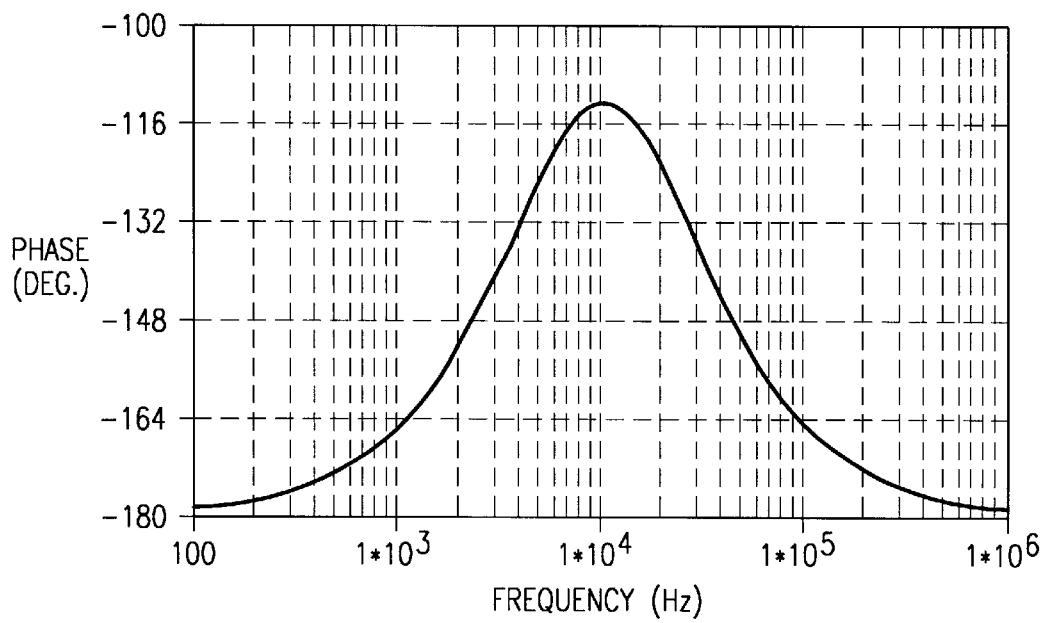
FIG. 6 provides an open loop Bode phase angle response plot for the example 2 zeros/2 poles active compensation phase locked loop of Table 1.

FIG. 6 shows the open loop Bode phase angle plot of FIG. 2 with the 2 zero/2 pole active compensation per the example of Table 1. The phase response peaks up about the desired crossover frequency of 10.5 kHz to give an optimum phase response.

Although the present invention and its advantages have been described in detail, it should be understood that various changes, substitutions and alterations can be made herein without departing from the spirit and scope of the invention as defined by the appended claims.

What is claimed is:

1. A phase locked loop with two zeros/two poles active compensation comprising:
    a node for receiving a signal source having a reference frequency;
    a programmable divider having an input and having an output;
    a phase detector with a first input coupled to said signal source, a second input coupled to the output of said programmable divider, a first output and a second output;
    an operational amplifier having a positive input, a minus input and an output;
    a first resistor and capacitor network coupled between said first phase detector output and the minus input of said operational amplifier, said first resistor and capacitor network comprising a first resistor in parallel with a second resistor and a first capacitor in series;
    a second resistor and capacitor network coupled between the minus input of said operational amplifier and the output of said operational amplifier, said second resistor and capacitor network comprising a second capacitor in parallel with a third resistor and a third capacitor in series;
    a third resistor and capacitor network coupled between said second phase detector output and the positive input of said operational amplifier, said third resistor and capacitor network comprising a fourth resistor in parallel with a fifth resistor and a fourth capacitor in series;
    a fourth resistor and capacitor network coupled between the positive input of said operational amplifier and a circuit ground, said fourth resistor and capacitor network comprising a fifth capacitor in parallel with a sixth resistor and a sixth capacitor in series; and
    a voltage controlled oscillator having an input connected to the output of said operational amplifier and having an output connected to the input of said programmable divider, said voltage controlled oscillator output also providing an output signal of said phase locked loop, said output signal having an output frequency.

2. The circuit of claim 1 in which said first, second, third and fourth resistor and capacitor networks functioning in said phase locked loop provide a two zero and two pole compensation network.

3. The circuit of claim 1 in which the output frequency is equal to n times the reference frequency.

4. The circuit of claim 3, wherein said phase locked loop has a geometric form factor k and a predetermined open loop 0 dB gain crossover frequency $f_x$, and wherein said phase locked loop has:

a first zero of $\dfrac{1}{C_3 \cdot R_3} = \dfrac{2 \cdot \pi \cdot f_x}{\sqrt{k}}$, a second zero of $\dfrac{1}{C_1 \cdot (R_1 + R_2)} = \dfrac{2 \cdot \pi \cdot f_x}{\sqrt{k}}$, a first pole of $\dfrac{1}{R_2 \cdot C_1} = 2 \cdot \pi \cdot f_x \cdot \sqrt{k}$, and a second pole of $\dfrac{1}{\dfrac{C_3 \cdot C_2}{(C_3 + C_2)} \cdot R_2} = 2 \cdot \pi \cdot f_x \cdot \sqrt{k}$, wherein
    $R_1$ represents the value of said first and fourth resistances,
    $R_2$ represents the value of said second and fifth resistances, R₃ represents the value of said third and sixth resistances,
C₁ represents the value of said first and fourth capacitances,
C₂ represents the value of said second and fifth capacitances,
C₃ represents the value of said third and sixth capacitances.

5. A phase locked loop according to claim 4, wherein said phase locked loop has an integrator term of:

$$\frac{1}{(C_3 + C_2) \cdot R_1} = \omega_x \cdot \frac{G_x}{k},$$

wherein
$\omega_x$ represents $2\pi f_x$, and
$G_x$ represents an active compensation gain and equals $$G_x = \frac{1}{\left(\frac{K_d \cdot K_v}{n \cdot \omega_x}\right)},$$

wherein
$K_d$ prepresents a phase detector gain,
$K_v$ prepresents a voltage controlled oscillator gain, and
n represents a programmable divider ratio.

6. A phase locked loop integrated circuit with two zeros/two poles active compensation comprising:
a signal source having a reference frequency;
a programmable divider having an input and having an output;
a phase detector with a first input coupled to said signal source, a second input coupled to the output of said programmable divider, a first output and a second output;
an operational amplifier having a plus input, a minus input and an output;
a first resistor and capacitor network coupled between said first phase detector output and the minus input of said operational amplifier, said first resistor and capacitor network comprising a first resistor in parallel with a second resistor and a first capacitor in series;
a second resistor and capacitor network coupled between the minus input of said operational amplifier and the output of said operational amplifier, said second resistor and capacitor network comprising a second capacitor in parallel with a third resistor and a third capacitor in series;
a third resistor and capacitor network coupled between said first phase detector output and the positive input of said operational amplifier, said third resistor and capacitor network comprising a fourth resistor in parallel with a fifth resistor and a fourth capacitor in series;
a fourth resistor and capacitor network coupled between the positive input of said operational amplifier and a circuit ground, said fourth resistor and capacitor network comprising a fifth capacitor in parallel with a sixth resistor and a sixth capacitor in series; and
a voltage controlled oscillator having an input connected to the output of said operational amplifier and having an output connected to the input of said programmable divider, said voltage controlled oscillator output also providing an output signal of said phase locked loop, said output signal having an output frequency.

7. A phase locked loop, comprising:
an input port for receiving a reference frequency;
a phase detector having a first input coupled to said input port, having a second input and having an output;
an active compensation network having an input coupled to the output of the phase detector and having an output, the active compensation network having two zeros/two poles below a 0 dB crossover frequency;
a voltage controlled oscillator having a control input coupled to the output of the active compensation network, and having an output providing an output of the phase locked loop; and
a signal path from the output of the voltage controlled oscillator and the second input of the phase detector.

8. A phase locked loop according to claim 7, further comprising a frequency divider disposed between the output of the voltage controlled oscillator and the second input of the phase detector.

9. A phase locked loop with two zeros/two poles active compensation comprising:
a node for receiving a signal source having a reference frequency;
a programmable divider having an input and having an output;
a phase detector with a first input coupled to said signal source, a second input coupled to the output of said programmable divider and a first output;
an amplifier having an input and an output;
a first resistor and capacitor network coupled between said phase detector output and the input of said operational amplifier, said first resistor and capacitor network comprising a first resistor in parallel with a second resistor and a first capacitor in series;
a second resistor and capacitor network coupled between the input of said operational amplifier and the output of said operational amplifier, said second resistor and capacitor network comprising a second capacitor in parallel with a third resistor and a third capacitor in series; and
a voltage controlled oscillator having an input connected to the output of said operational amplifier and having an output connected to the input of said programmable divider, said voltage controlled oscillator output also providing an output signal of said phase locked loop, said output signal having an output frequency.

10. A phase locked loop according to claim 9, wherein said phase locked loop has a geometric form factor k and a predetermined open loop 0 dB gain crossover frequency $f_x$, and wherein said phase locked loop has:

a first zero of $\dfrac{1}{C_3 \cdot R_3} = \dfrac{2 \cdot \pi \cdot f_x}{\sqrt{k}},$ a second zero of $\dfrac{1}{C_1 \cdot (R_1 + R_2)} = \dfrac{2 \cdot \pi \cdot f_x}{\sqrt{k}},$ a first pole of $\dfrac{1}{R_2 \cdot C_1} = 2 \cdot \pi \cdot f_x \cdot \sqrt{k},$ and a second pole of $\dfrac{1}{\frac{C_3 \cdot C_2}{(C_3 + C_2)} \cdot R_2} = 2 \cdot \pi \cdot f_x \cdot \sqrt{k},$ wherein
$R_1$, $R_2$ and $R_3$ represent the values of said first, second and third resistances, respectively, and $C_1$, $C_2$ and $C_3$ represent the values of said first, second and third capacitances, respectively.

11. A phase locked loop according to claim 10, wherein said phase locked loop has an integrator term of:

$$\frac{1}{(C_3+C_2)\cdot R_1} = \omega_x \cdot \frac{G_x}{k},$$

wherein $\omega_x$ represents $2\pi f_x$, and $G_x$ represents an active compensation gain and equals $$G_x = \frac{1}{\left(\frac{K_d \cdot K_v}{n \cdot \omega_x}\right)},$$

wherein $K_d$ prepresents a phase detector gain, $K_v$ prepresents a voltage controlled oscillator gain, and n represents a programmable divider ratio.

* * * * *